(12) United States Patent
Niemi et al.

(10) Patent No.: US 8,716,603 B2
(45) Date of Patent: May 6, 2014

(54) PRINTED WIRING BOARD WITH DIELECTRIC MATERIAL SECTIONS HAVING DIFFERENT DISSIPATION FACTORS

(75) Inventors: Ian Sakari Niemi, Turku (FI); Ilkka Johannes Kartio, Turku (FI); Kimmo Markus Perala, Pertteli (FI); Kari Viljo Jalmari Virtanen, Raisio (FI); Hannu Vaino Kalevi Ventomaki, Salo (FI)

(73) Assignee: Nokia Corporation, Espoo (FI)

( * ) Notice: Subject to any disclaimer, the term of this patent is extended or adjusted under 35 U.S.C. 154(b) by 478 days.

(21) Appl. No.: 12/954,001

(22) Filed: Nov. 24, 2010

(65) Prior Publication Data
US 2012/0125664 A1 May 24, 2012

(51) Int. Cl.
*H05K 1/00* (2006.01)

(52) U.S. Cl.
USPC ........... 174/250; 174/255; 361/777; 361/779; 361/780

(58) Field of Classification Search
USPC ................... 174/250, 255; 361/777, 779, 780
See application file for complete search history.

(56) References Cited

U.S. PATENT DOCUMENTS

| | | | |
|---|---|---|---|
| 5,581,262 A | 12/1996 | Kawahata et al. | 343/700 |
| 5,608,413 A | 3/1997 | Macdonald | 343/700 MS |
| 5,990,839 A | 11/1999 | Schefte et al. | 343/702 |
| 6,504,444 B1 | 1/2003 | Furuya et al. | 333/1.1 |
| 6,759,987 B2 | 7/2004 | Schmidt et al. | 343/700 |
| 6,822,876 B2 | 11/2004 | Goergen | 367/788 |
| 6,941,649 B2 | 9/2005 | Goergen | 29/846 |
| 7,019,221 B1 * | 3/2006 | Noda | 174/255 |
| 7,102,578 B2 | 9/2006 | Minemura | 343/702 |
| 7,126,547 B2 | 10/2006 | Kim et al. | 343/702 |
| 7,130,591 B2 | 10/2006 | Iwai et al. | 455/90.3 |
| 7,289,069 B2 | 10/2007 | Ranta | 343/702 |
| 7,345,633 B2 * | 3/2008 | Wielsma | 343/700 MS |
| 7,564,424 B2 | 7/2009 | Umehara | 343/895 |
| 7,759,161 B2 | 7/2010 | Tanaka et al. | 438/106 |
| 2006/0238421 A1 | 10/2006 | Wielsma | 343/700 |

(Continued)

FOREIGN PATENT DOCUMENTS

| | | |
|---|---|---|
| CN | 1014263330 A | 5/2009 |
| EP | 1 209 758 A1 | 5/2002 |

(Continued)

OTHER PUBLICATIONS

G. Wildes et al. "Substrates Based on FR4 Core Constructions Utilizing Low Loss Microvia Dielectrics Can Offer Low Cost, High Performance", Wireless Design & Development, Electrical Performace of Microvia PCB Materials, downloaded Oct. 5, 2010 http://wirelessexpo.net/ShowPR.aspx?PUBCODE=055&ACCT=0031196&ISSUE=0304&RELTYPE=PR&PRODCODE=00000&PRODLETTT=B&CommonCount=0.

(Continued)

*Primary Examiner* — Andargie M Aychillhum
(74) *Attorney, Agent, or Firm* — Harrington & Smith

(57) ABSTRACT

An apparatus including a first printed wiring board section and a second printed wiring board section. The first printed wiring board section includes a first dielectric material layer. The first dielectric material layer has a first dissipation factor. The second printed wiring board section is directly attached with the first printed wiring board section to form a unitary printed wiring board structure. The second printed wiring board section includes a second dielectric material layer and an antenna on the second dielectric material layer. The second dielectric material layer has a different second dissipation factor.

14 Claims, 7 Drawing Sheets

(56) References Cited

U.S. PATENT DOCUMENTS

| | | | |
|---|---|---|---|
| 2008/0036668 A1 | 2/2008 | White et al. | 343/745 |
| 2008/0093118 A1 | 4/2008 | Takahashi et al. | 174/264 |
| 2008/0264679 A1* | 10/2008 | Sandwall | 174/255 |
| 2009/0174557 A1 | 7/2009 | Nikitin et al. | 340/572.7 |
| 2010/0045560 A1* | 2/2010 | Sakuma et al. | 343/793 |
| 2010/0063226 A1 | 3/2010 | Cho et al. | 526/120 |

FOREIGN PATENT DOCUMENTS

| | | |
|---|---|---|
| EP | 1 793 448 B1 | 6/2009 |
| GB | 2 389 246 B | 8/2005 |
| JP | 57-202104 | 12/1982 |
| JP | 61-281704 | 12/1986 |
| JP | 2006-121659 A | 5/2006 |
| KR | 2002/0041701 | 6/2002 |
| KR | 2002/0041705 | 6/2002 |
| KR | 2007/0087792 | 8/2007 |
| WO | WO-00/11747 A1 | 3/2000 |
| WO | WO 2005/029634 A2 | 3/2005 |
| WO | WO-2006/059924 A1 | 6/2006 |
| WO | WO-2007/116344 A1 | 10/2007 |
| WO | WO 2008/105867 A1 | 9/2008 |

OTHER PUBLICATIONS

J. Chen et al., "Characterization of Low Loss Material for High Frequency PCB Application", pp. 373-376, Publication date: Oct. 1-3 ,2007; http://ieeexplore.ieee.org/Xplore/login.jsp?reload=true&url=http%3A%2F%2Fieeexplore.ieee.org%2Fapplication%2Fenterprise%2Fentconfirmationmjsp%3Farnumber%3D04433639&authDecision+-203.

Trackwise—Specialist Manufacturer of PCB Antennas, http://www.trackwise.co.uk/www/materials-performance.htm, Oct. 7, 2010, 7 pages.

"Circular Dipole Antenna for Mode 1 UWB Radio With Integrated Balun Utilizing a Flex-Rigid Structure", IEEE Transactions on Antennas and Propagation, vol. 57, No. 10, Oct. 2009, p. 2967-2971.

"Compact Multi-Band Planar Antenna for Mobile Wireless Terminals", Zygmond Turski et al., IEEE Xplore, Nov. 30, 2009. p. 454-457.

International Search Report for related International Patent Application No. PCT/FI2011/051026 filed Nov. 22, 2011, mailed Apr. 20, 2012.

* cited by examiner

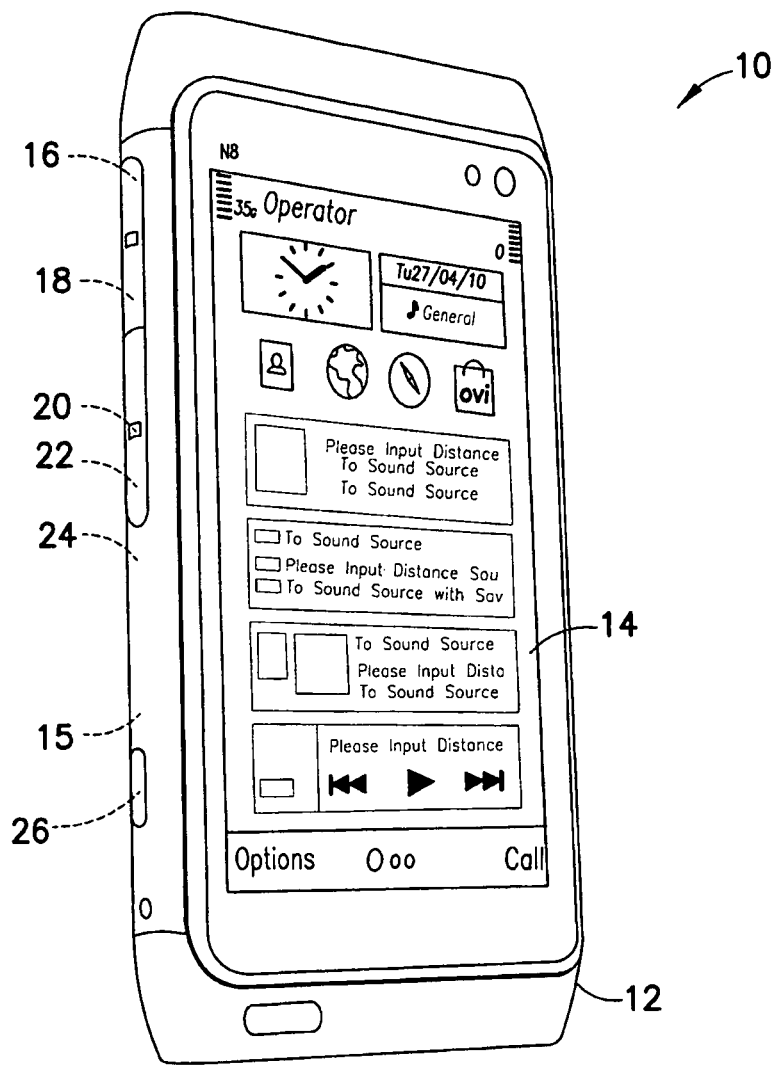
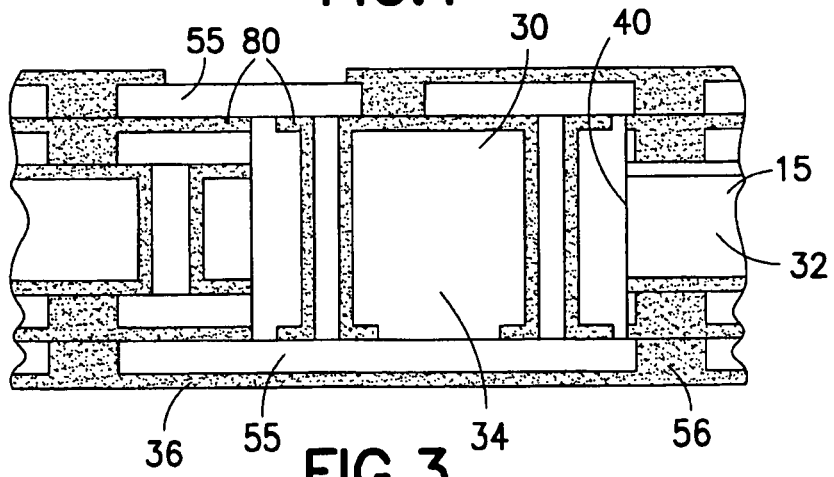
FIG.1
FIG.3

PRINTED WIRING BOARD WITH DIELECTRIC MATERIAL SECTIONS HAVING DIFFERENT DISSIPATION FACTORS

BACKGROUND OF THE INVENTION

1. Field of the Invention

The invention relates to a printed wiring board and, more particularly, to a printed wiring board having sections comprising laminates with different dissipation factors.

2. Brief Description of Prior Developments

A printed wiring board (PWB) has a substrate comprised of an epoxy resin laminate. Modern mobile telephones can have one or more antenna integrated on or as an integral part of a PWB. The antenna may be an integral part of the PWB or it may be located above a surface of the PWB or other conductive member providing a ground plane. Various different substrates are available for an integrated antenna PWB substrate which can minimize parasitic loss (such as heat) that results from subjecting the dielectric material of the substrate to an alternating electric field. Dissipation factor is a measurement of this parasitic loss. Loss tangent is effectively the same as dissipation factor, they take slightly different views which are useful when designing different types of circuits. Conventional materials, such as FR-4 for example, have been used for mobile telephone PWB substrates because of their dielectric constant and dissipation factor to enable support of the antenna on the mobile telephone PWB substrate. For example, FR-4 has a dielectric constant (Dk) of about 4.5-4.9 and a dissipation factor (Df) of about 0.013-0.020. Newer telephone radio standards, such as 3G and 4G for example, use RF frequencies above 1 GHz, such as 2 Ghz and above. Conventional integrated antenna PWB substrates are not suited for integral antenna application with these higher RF frequencies due to their relatively high dielectric constants (Dk or Er) and loss (Df or tan $\delta$).

SUMMARY

The following summary is merely intended to be exemplary. The summary is not intended to limit the scope of the claimed invention.

In accordance with one aspect of the invention, an apparatus is provided including a first printed wiring board section and a second printed wiring board section. The first printed wiring board section includes a first dielectric material layer. The first dielectric material layer has a first dissipation factor. The second printed wiring board section is directly attached with the first printed wiring board section to form a unitary printed wiring board structure. The second printed wiring board section includes a second dielectric material layer and an antenna on the second dielectric material layer. The second dielectric material layer has a different second dissipation factor.

In accordance with another aspect of the invention, a method comprises providing a first printed wiring board module comprising a first dielectric material layer, the first dielectric material layer comprising a first dissipation factor; providing a second printed wiring board module separate from the first printed wiring board module, the second printed wiring board module comprising a second dielectric material layer having a different second dissipation factor; and connecting the second printed wiring board module directly to the first printed wiring board module to form a unitary printed wiring board structure.

In accordance with another aspect of the invention, an apparatus is provided comprising a first printed wiring board section comprising a first dielectric material layer, the first dielectric material layer having a first loss tangent greater than 0.001; and a second printed wiring board section which is smaller than the first printed wiring board section directly attached with the first printed wiring board section to form a unitary printed wiring board structure. The second printed wiring board section comprises a second dielectric material layer having a loss tangent of 0.001 or less.

In accordance with another aspect of the invention, a method comprises lay-up and alignment of components of a printed wiring board substrate comprising a first dielectric material layer with a first dissipation factor and a separate second dielectric material layer with a second different dissipation factor, the second dissipation factor being lower than the first dissipation factor; pressing the components together where the second dielectric material layer is located as only a partial layer with all sides except one side covered by other ones of the components; drilling, imaging and plating on the components to form a printed wiring board; and forming an antenna circuit on the printed wiring board over the second dielectric material layer, a majority of the antenna circuit being located over the second dielectric material layer where the lower dissipation factor of the second dielectric material layer assists to reduce loss from antenna operation at a frequency above 2 Ghz.

BRIEF DESCRIPTION OF THE DRAWINGS

The foregoing aspects and other features of the invention are explained in the following description, taken in connection with the accompanying drawings, wherein:

FIG. 1 is a perspective view of an example of an apparatus comprising features of the invention;

FIG. 3 is a partial schematic cross sectional view of a portion of the printed wiring board shown in FIG. 2;

DETAILED DESCRIPTION OF EMBODIMENTS

Figure 2:
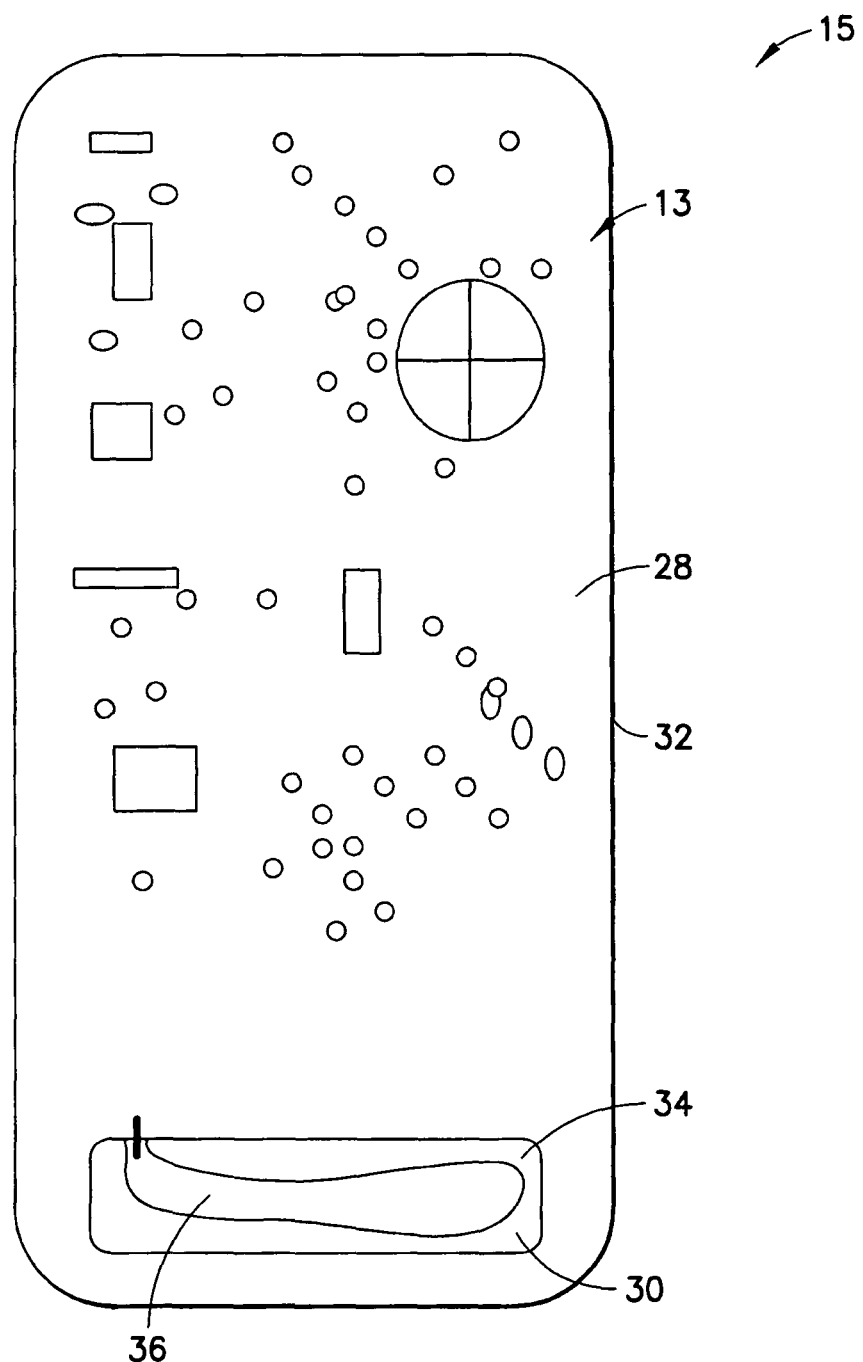
FIG. 2 is a schematic view of a printed wiring board in the apparatus shown in FIG. 1.

Although the invention will be described with reference to the example embodiments shown in the drawings, it should be understood that the invention may be embodied in many alternate forms of embodiments. In addition, any suitable size, shape or type of elements or materials could be used.

Referring to FIG. 1, there is shown a perspective view of an apparatus 10 according to an example embodiment of the invention. In this example the apparatus 10 is a hand-held portable apparatus comprising various features including a telephone application, Internet browser application, camera application, video recorder application, music player and recorder application, email application, navigation application, gaming application, and/or any other suitable electronic device application. The apparatus may be any suitable portable electronic device, such as a mobile phone, computer, laptop, PDA, etc.

The apparatus 10, in this example embodiment, comprises a housing 12, a touch screen 14 which functions as both a display and a user input, and electronic circuitry including a printed wiring board 15 (see FIG. 2) having at least some of the electronic circuitry 13 thereon. The electronic circuitry 13 can include, for example, a receiver 16, a transmitter 18, and a controller 20. The controller 20 may include at least one processor 22, at least one memory 24, and software. A rechargeable battery 26 is also provided.

Referring also to FIGS. 2 and 3, the printed wiring board 15 includes a first section 28 and a second section 30. In an alternate embodiment more than two sections could be provided. The first section 28 comprises a first substrate 32. The first substrate 32 comprises a first epoxy laminate having a first dielectric material layer with a first dissipation factor. The second section 30 is directly attached with the first section 28 to form a unitary printed wiring board structure. The second section 30 comprises a second substrate 34 and an antenna 36 on the second substrate 34. The second substrate 34 comprises a second epoxy laminate having a second dielectric material layer with a different second dissipation factor.

The first substrate 32 forms a majority of the substrate for the PWB 15. In the example shown the second substrate 34 forms only about 5 percent or less of the total substrate of the PWB 15. In other example embodiments the first substrate 32 may have a smaller area than the second substrate 34. For example, if there is a plurality of antennas on the overall PWB 15 then there may be a plurality of second substrates 34. The second substrate 34 is located in a recess or pocket 40 of the first substrate 32. The first laminate is preferably a conventional material such as FR-4 or FR-5 for example. This is a relatively inexpensive substrate material and has sufficient properties for all the electronic circuitry 13 except the high frequency antenna 36. The second laminate of the second substrate 34 has a different material composition than the first substrate 32. In particular, it has low loss (a low dissipation factor (Df)) at high frequencies (such as about 2 Ghz for example). However, it is more expensive than the conventional material used for the first substrate 32.

FR-4 has dielectric constant (Dk) of about 4.5-4.9 and a dissipation factor (Df) of about 0.013-0.020. In an alternate embodiment a material similar to FR-4 could be used for the first substrate. Newer telephone radio standards, such as Ultra Wideband (UWB), 3G and 4G for example, use RF frequencies above 1 GHz, such as 2 Ghz and above. UWB frequencies range from about 3 GHz to about 10.6 GHz, for example. For a PWB substrate intended to have an antenna integrated thereon (such as being patterned on the substrate) material such as FR-4 cannot be used for such higher frequencies because of too much loss (Df or tan δ). Thus, the second laminate of the second substrate 34 is comprised of a material with a lower dissipation factor (Df) than the material of the first substrate 32. In a preferred embodiment the material of the second laminate has a dissipation factor (Df) of about 0.001 or less. Examples could include the following:

| Product | Supplier | Dielectric Constant (Dk) | Dissipation Factor (Df) |
|---|---|---|---|
| NY9208(IM) | Neltec | 2.08 ± 0.02 | 0.0006 |
| CuFlon | Polyflon | 2.1 | 0.00045 |
| TLP-5A | Taconic | 2.15 | 0.0009 |
| DiClad 880 | Arion | 2.17-2.20 ± 0.02 | 0.0009 |
| CuClad 217 | Arion | 2.17-2.20 ± 0.02 | 0.0009 |
| MY9217(IM) | Neltec | 2.17 ± 0.02 | 0.0008 |
| TLY | Taconic | 2.17-2.33 ± 0.02 | 0.0009 |
| RT/duroid 5880 | Rogers | 2.20 ± 0.02 | 0.0009 |
| NY9220 (IM) | Neltec | 2.20 ± 0.02 | 0.0009 |

These materials for the second substrate 34 are more expensive than a material such as FR-4 or FR-5 used for the first substrate. Thus, the PWB 15 merely uses these second laminate materials at the antenna 36 where their higher costs are justified by their properties to reduce loss from the higher frequency antenna operation.

Ceramics, Teflon and Ferrite are also possible embedded material options. Novel materials that can be embedded on top of conventional FR-4 and FR-5 materials can include, for example:

LCP (Liquid Crystal Polymer) (Dk 3.16 and tan δ or loss tangent 0.0049)
    Alumina (Al2O3) (Dk 9.7 and tan δ or loss tangent $2 \times 10^{-4}$)
    Teflon (Dk 2.06 and tan δ or loss tangent $3 \times 10^{-4}$)
    Ceramic (Dk and tan δ or loss tangent varies based on different composites)
    Ferrite (magnetic ceramics): Two types (Isotropic and Anisotropic magnets)

Increasing data/signal speed and embedded or integrated mobile antennas are increasing in portable devices where performance, size and cost application solutions are continuously evolving. Integrated antennas in PWB were previously restricted by material properties used in conventional PWB manufacturing. Integrated antennas in a PWB, where the antenna operated in frequencies above 1 Ghz, were not possible because, firstly, if the PWB substrate was made of a conventional substrate material there would be excessive parasitic loss from antenna operation at such high frequencies, and secondly, if the whole mobile telephone PWB substrate was made of a low loss material which could accommodate the antenna operated in frequencies above 1 Ghz, the cost of the material would be too large to allow commercialization at a reasonable price which consumers would buy. Thus, for a mobile telephone having an antenna operating above 1 Ghz in the past, rather than using a PWB with an integrated antenna, a separate antenna module was manufactured and subsequently attached to the PWB and no integrated antenna was provided on the PWB. However, a PWB with an integrated antenna is desired because it allows for miniaturization of a hand held communication device.

With RF communication frequencies for hand held communicators increasing (such as 2 Ghz and above), there is a need for low Dielectric Constant (Dk) and loss [dissipation factor (Df)] materials for a PWB substrate due to material losses. The current low Dk and loss materials are too expensive to be used as a mobile terminal PWB material for an entire PWB substrate, but the materials are necessary to enable good performance in 3G and 4G frequency range if the antenna is to be integrated in the PWB or as a separate antenna component or module placed above the surface of the PWB but relying on the second substrate 34 as a dielectric material beneath the antenna radiator for optimal antenna performance. An example embodiment of the invention can use partial HDI (High Density Interconnect) and/or Hybrid Lamination technologies to enable the use of low Dk and low loss material in merely the integrated antenna circuit area (rather than the entire PWB substrate), and reduces significantly the cost of the apparatus engine/module of the PWB 15 compared to using low loss material for an entire PWB substrate.

An integrated antenna in a PWB enables further miniaturization of end products. The Partial HDI and/or Hybrid Lamination technologies with limited amount of low Dk and low loss material solve a high material cost issue. This invention would also enable local optimization of the PWB layer structure to serve antenna needs without changing the PWB design (structure, routing) in the engine area. This could speed up development cycle time.

In the past, a Low Dk and Low loss material could not be used in entire engine PWB substrate because of excessively high costs and, therefore, separate antenna modules were mainly used. As non-limiting examples, the UWB, 3G and 4G (Long Term Evolution—LTE) frequencies with multiband applications are emerging and, therefore, antenna integration in the PWB becomes difficult due to the conventional material properties. As frequencies increase above 2 GHz the loss of the material increases, and especially so for FR4 which becomes so lossy that it cannot be used for an acceptable level of radiation efficiency (or bandwidth or both) for a given antenna design. The consequence of using higher dielectric constant material (Er≥5) means that typically the bandwidth of the resultant antenna becomes narrower due to the effect of the material (alumina for example), i.e. the conduction current losses in the material cause the bandwidth to decrease as frequency rises. So keeping the dielectric constant low (i.e. <5) can be an advantage for this reason, but this makes the antenna radiator size larger than for a higher dielectric constant material.

For microwave materials the Dissipation factor (tan δ or loss tangent) is a ratio of conductance (σ) to the product of angular frequency and permittivity (w∈), where the permittivity is that due to the dielectric material and is a measure of the capacity of the material to store electrical energy. The conductance of a material would normally be greater than zero and so a conduction current will flow in the material in phase with the applied electric field and power will be dissipated. This constitutes loss in the dielectric material and, therefore, the field decays as it propagates. Further the conducting planes on the surface(s) of the dielectric will have some resistance too and so will add further to the overall losses. The speed of an electromagnetic wave is therefore reduced. As permittivity increases the energy stored in the electric field for a given field strength increases and the speed of propagation of an electromagnetic wave decreases. Permittivity can also vary as a function of direction within the material, location within the material, the strength and frequency of the applied field. The relative permittivity is the ratio of the permittivity of the material to that of free space (8.854×10^−12 farads/meter).

However, keeping the relative permittivity roughly constant when changing from FR4 to the second substrate 34, there is an improvement in loss with respect to frequency, so in this case for a given antenna design we should have a greater bandwidth than that for the FR4 equivalent. So this is not necessarily enabling multiband operation, but more a case of improving bandwidth which in turn may enable multiband operation. Multiband operation may require operating over several operational bands which are distinctly separate in the frequency spectrum, and no single antenna structure could cover that on its own. Thus, having a single piece of a second substrate material may not be enough to cover multiband and we may need several antennas disposed on a single large piece of second substrate or several discrete pieces of second substrate material having one or more antenna disposed thereon.

An example embodiment of the invention can enhance the integrated antenna performance by utilizing low Dk and low loss materials cost efficiently (only in the antenna circuit area). The Partial HDI and Hybrid Lamination concepts enable the use of a restricted amount of Low Dk and Low loss material in locally optimized layer structures. The Low Dk and low loss materials are very expensive as PWB substrate material. Thus, with the invention only a small part is needed in the antenna circuitry area. The partial HDI and Hybrid Lamination technologies enable the use of low Dk and low loss material that are needed for acceptable performance in multiband solutions and higher frequencies. A RCC (Resin Coated Cupper)/Prepreg layer might cause some losses, but the thickness of the RCC and Prepreg (about 40 um for example) enables the effective Dk to be dominated by Low Dk and low loss material properties (ratio is larger for the Low Dk and low loss material, which improves the effective Dk and loss).

Figure 4:
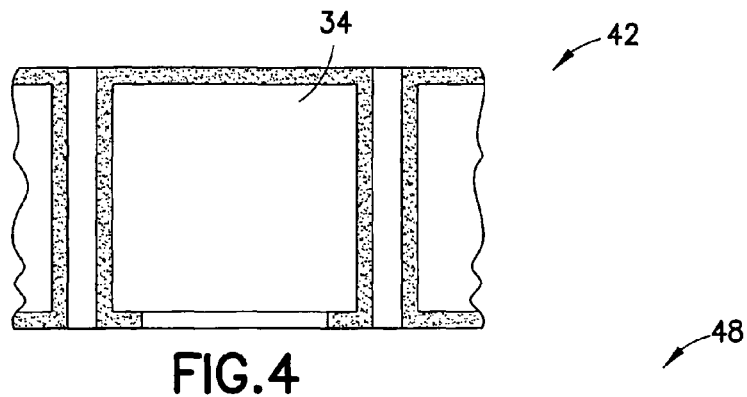
FIG. 4 is a schematic cross sectional view of a substrate module or plug used to form the printed wiring board shown in FIG. 3.
Figure 5:
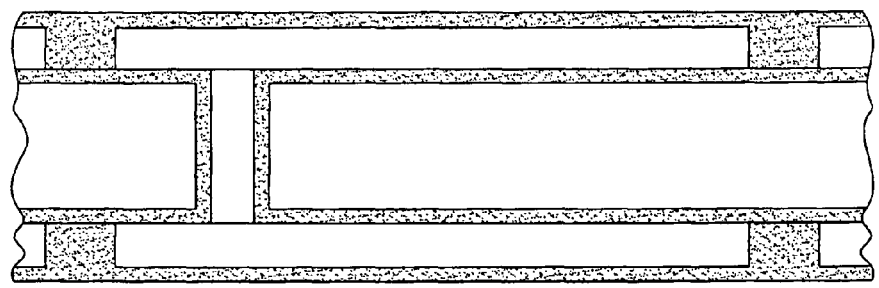
FIG. 5 is a schematic cross sectional view of a portion of a substrate used to form the printed wiring board shown in FIG. 3.
Figure 6:
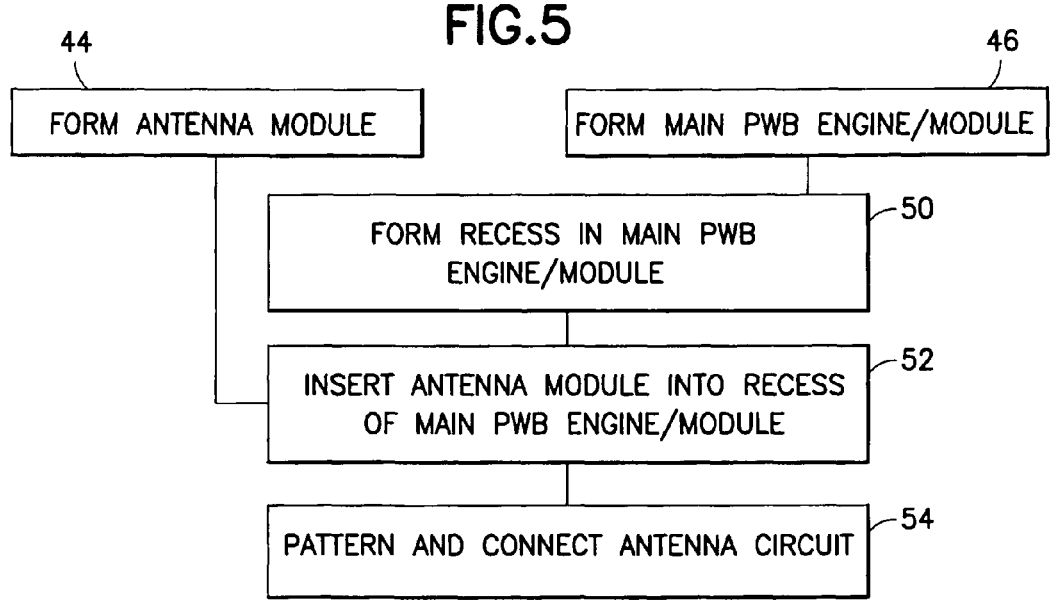
FIG. 6 is a diagram illustrating some steps used in an example method of the invention.
Figure 7:
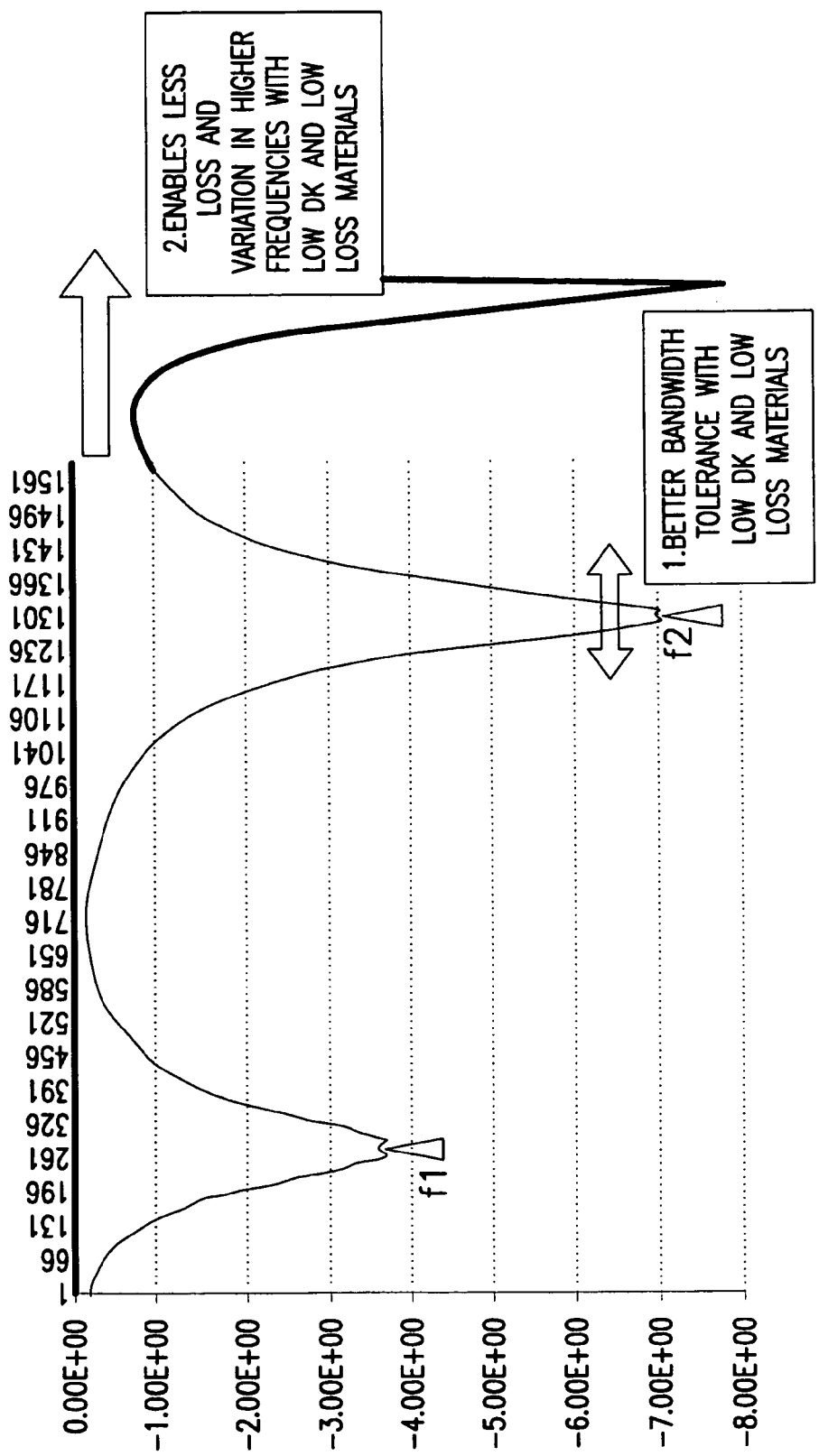
FIG. 7 is a chart illustrating advantages of bandwidth tolerance and less low and variation in higher frequencies using low Dk and low lass materials at an antenna area of a printed wiring board.

Referring also to FIGS. 4-6, one example method comprises forming 44 an antenna module 42 as shown in FIG. 4 and forming 46 a main PWB engine/module 48 as shown in FIG. 5. The antenna module 42 is formed using the second substrate 34 having the second laminate material. The main PWB engine/module 48 is formed 46 using the first substrate having the first laminate material in a conventional manner. The recess 40 is formed 50 in the main PWB engine/module 48. For example, the recess 40 may be routed out of the main PWB engine/module 48, or formed during formation of the main PWB engine/module 48. The antenna module 42 is inserted into the recess 40. Layers 55 (see FIG. 3) are connected to at least partially mechanically join the substrates. Then, as indicated by block 54 the antenna circuit 36 is patterned over the second substrate 34 and connected to the main PWB engine/module 48, such as by microvias 56 for example. The assembly can then be finished as a PWB engine in a conventional manner. There can be a lay up, press, outer laser drilling, plating, surface mount (SM), surface finish and routing. This method is a partial HDI process. As illustrated from the example chart shown in FIG. 7, low Dk and low loss materials can provide better bandwidth and enables less loss and variation in higher frequencies. The use of low loss materials enables return loss improvements, and enables bandwidths with improved tolerance.

Figure 8:
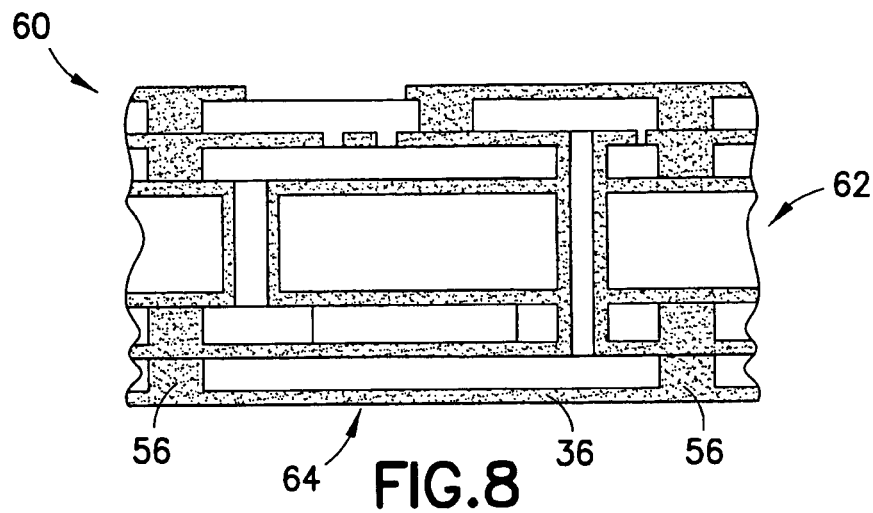
FIG. 8 is a partial schematic cross sectional view of a portion of a printed wiring board of an alternate embodiment of the invention.
Figure 9:
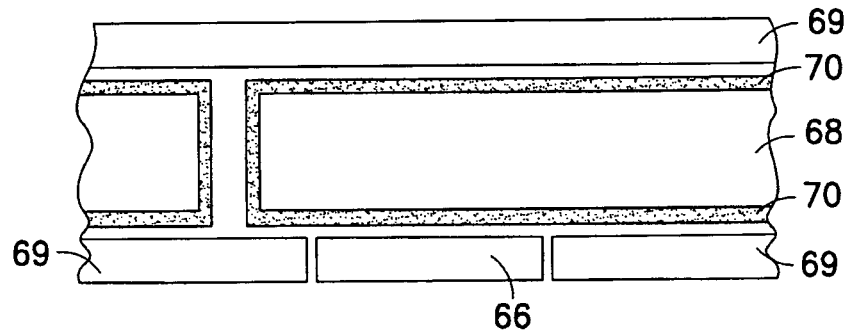
FIG. 9 is a partial schematic cross sectional view of some components used to form the printed wiring board shown in FIG. 8 being layed up and aligned.
Figure 10:
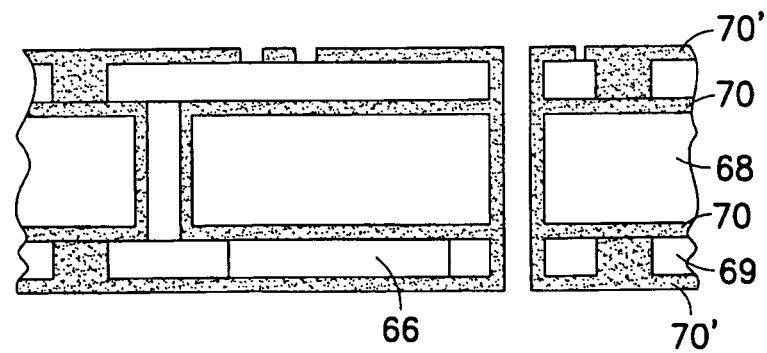
FIG. 10 shows the components of FIG. 9 pressed, drilled and plated to form a printed wiring board substrate.

Referring also to FIG. 8, an alternate example embodiment is shown. In this example embodiment a PWB 60 is provided having a first section 62 and a second section 64. The antenna 36 is provided at the second section 64. The PWB 60 is formed using a hybrid lamination process. At least one piece 66 of low DK and low loss material is fabricated inside the PWB during otherwise normal fabrication. As indicated by FIG. 9, initially there is a lay-up and alignment of the low loss substrate material 66 with the other components 68, 69, of a conventional PWB substrate, such as having a conventional non-low loss epoxy material such as FR-4. There is a subsequent press, drilling, imaging and plating to form the combined substrates shown in FIG. 10. The low loss substrate material 66 is inside the assembly. The antenna circuit 36 can then be patterned and connected, such as by microvias 56 for example. The assembly can then be finished as a PWB engine in a conventional manner.

Figure 11:
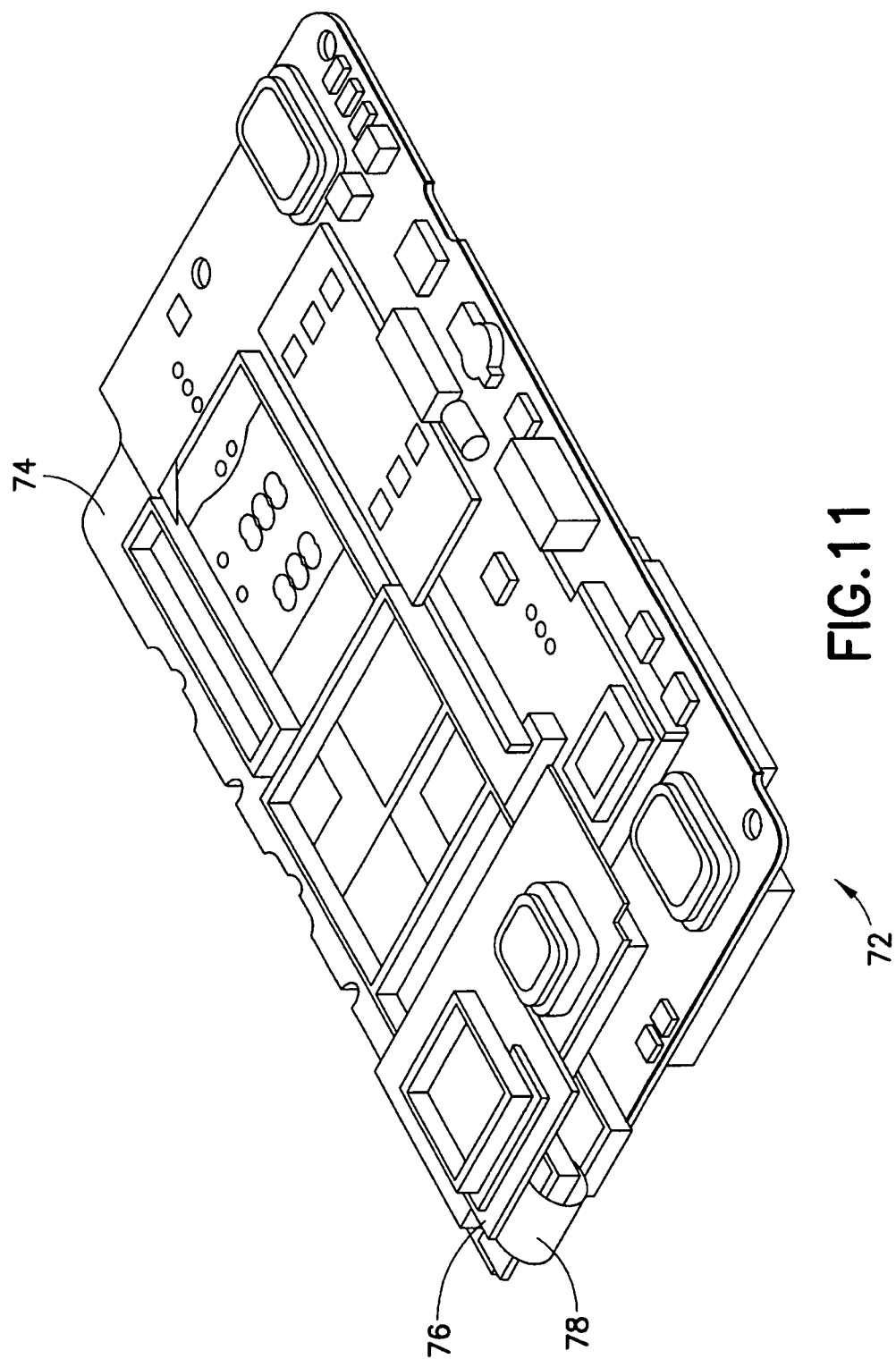
FIG. 11 is a perspective view of a subassembly of an electronic apparatus having two printed siring boards connected by a flex circuit.
Figure 12:
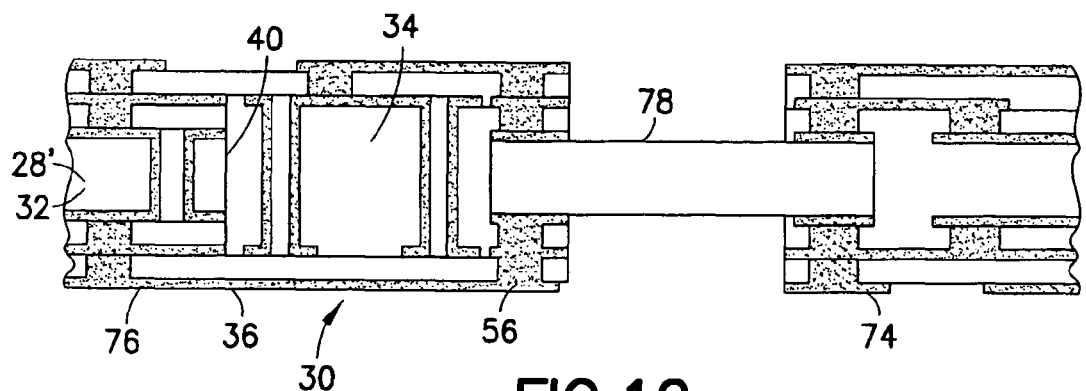
FIG. 12 is a partial schematic cross sectional view of a portions of the subassembly shown in FIG. 11.

FIG. 11 illustrates another example embodiment of the invention. FIG. 11 shows a subassembly 72 of an electronic apparatus, such as the apparatus 10 shown in FIG. 1. Referring also to FIG. 12, the subassembly 72 has two printed wiring boards (PWB) 74, 76 connected by a flex circuit or conductor 78. The first PWB 74 can comprise the majority of the electronics of the subassembly, such as the controller, the receiver, the transmitter, the microphone, the speaker, etc. The flex circuit 78 is integrally formed with the first PWB 74, such as by the method described in U.S. patent application Ser. No. 12/655,839 which is hereby incorporated by reference in its entirety. The same process can be used to integrally form the second PWB 76 with the flex circuit 78. Respective opposite ends of the flex circuit are, thus, embedded in the two PWBs 74, 76. An apparatus 72 is provided comprising a first printed wiring board 74 comprising a core having a power layer and a ground layer; and a second printed wiring board 76 and a flexible portion 78 that is partially embedded within an end section of the first printed wiring board 74 and abutting the core; in which the flexible portion comprises a first layer comprising an antenna feed coupled to the power layer of the core, and a second layer.

The second PWB 76 has a partial HDI configuration similar to FIG. 3 with a first section 28' and a second section 30. The first section 28' comprises a first substrate 32 with the first laminate material and a recess 40. The second section 30 is the same as that shown in FIG. 3 with a second substrate 34 having a second low loss laminate material. The second substrate is located in the recess 40. The antenna 36 is formed on the second section 30 and connected, such as by microvias 56, to the first section 28'. The lead formed by the flex circuit 78 electrically connects the antenna 36 from the second PWB 76 to circuitry on the first PWB 74. The flexible nature of the flex circuit 78 allows the second PWB 76 to be folded over the first PWB 74 into the position shown in FIG. 11.

Figure 13:
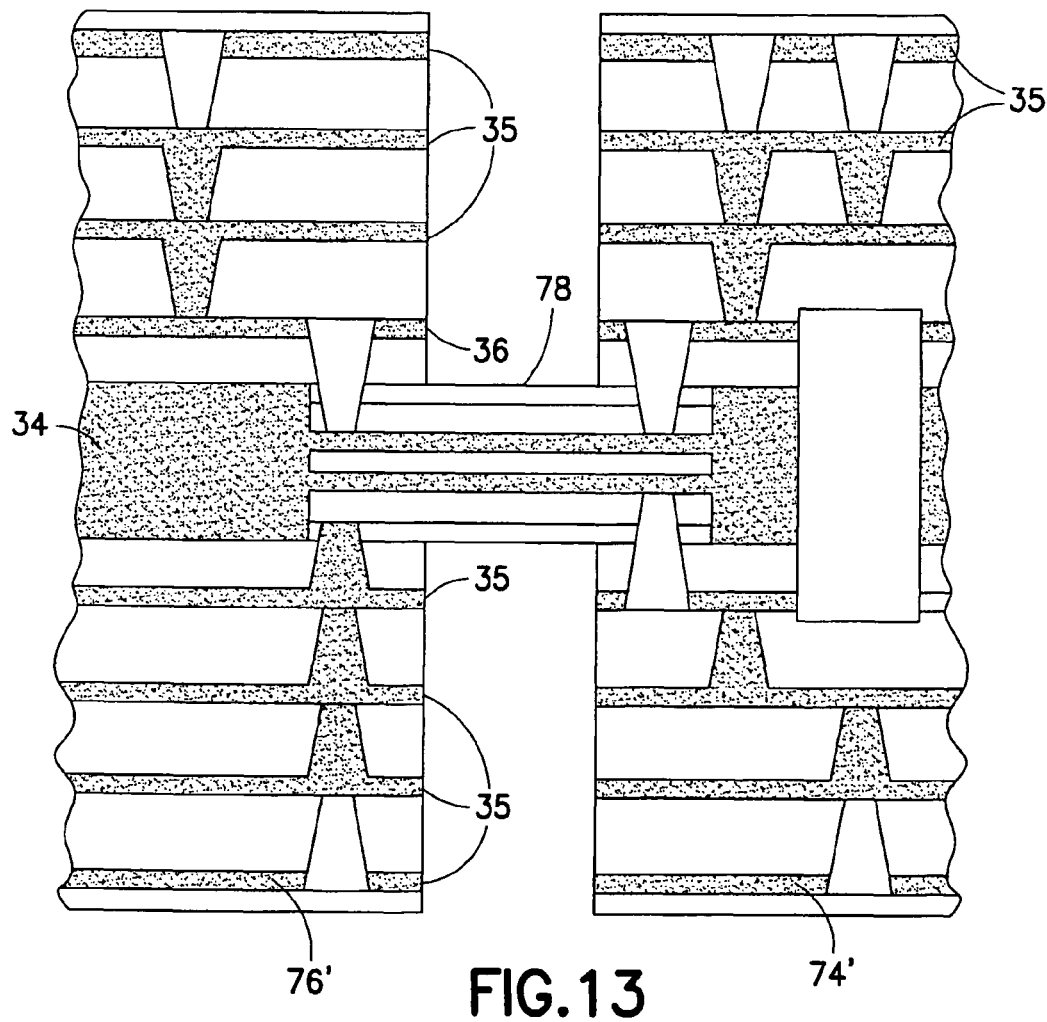
FIG. 13 is a partial schematic cross sectional view similar to FIG. 12 of a portion of an alternate embodiment of the subassembly shown in FIG. 11.

It should be noted that although the example embodiments of FIGS. 12 and 3 show an antenna module consisting of only two PWB copper layers, by using embedding technology the antenna or some other RF block (with any layer structure) can be embedded between the outermost layers of the PWB similar to the module 34 being embedded. Thus, there could be more than two copper layers at the second section 30. The invention can provide a printed wiring board with embedded bodies having different dissipation factors. The body could refer to a sub-board or a structure with multiple layers. Partial HDI technology would have at least one layer on both sides of the embedded body (module), so the Partial HDI module would not be embedded without at least one common layer on both top and bottom sides. An example of this is shown in FIG. 13 which is similar to FIG. 12, but has multiple copper layers 35. The flex connector 78 connects the two PWB 74' and 76' to each other. The second PWB 76' has an embedded body 34 described above.

The nature of increasing data/signal speed and embedded mobile antennas are increasing in portable devices where performance, size and cost application solutions having integrated antennas in a PWB are restricted by material properties used in conventional PWB manufacturing. The need for low dielectric constant (Dk or Er [relative permittivity]) and low loss materials (materials having a minimal loss at RF frequencies, i.e. in some circumstances having a loss tangent [tan δ] less than 0.001) is emerging when frequencies are increasing (2 GHz and above) because, at these frequencies, material losses become more apparent. The current low Dk and low loss materials are very expensive to be used as mobile terminal PWB material, but such materials are necessary to enable good performance in 3G and 4G frequency range if an antenna is to be integrated in a PWB. Partial HDI and Hybrid Lamination technologies enable the use of low Dk and/or low loss material in an integrated antenna circuit area of a PWB, and reduce significantly the cost of the engine/module.

Providing an antenna solution for multiband operation may require optimization of available bandwidth and better tolerances, which may not be possible with current conventional PWB materials. Usually, antenna designers aim for maximum available bandwidth for a given set of physical parameters. The printed wiring board and surrounding materials adjacent an antenna radiator affect the radio frequency (RF) performance, so careful consideration must be taken when designing an antenna with all material properties taken into account.

The invention can provide local optimization of the HDI-PWB structure by adding "antenna friendly" materials to the HDI-PWB in the vicinity of one or more antennas, which enable single or multiband operation. Therefore, the integrated antenna performance is enhanced by utilizing low loss materials cost efficiently (by only providing these materials in the antenna circuit area). The low dielectric constant may provide some advantages in some operational frequency bands, but not necessarily all, and in some cases it may be more advantageous to have a high dielectric constant to reduce the size of the antenna.

Conventional materials are not optimal for antenna application due to relatively high loss material, this is especially prominent at frequencies above 2 GHz where for example FR-4 (a well known multi-layer PWB material) RF losses may increase non-linearly as frequency increases. If the Low Dk and low loss material was used for the whole area of a PWB this would be prohibitively expensive, so only a small part or localized area is needed in the antenna area, thus, keeping the overall material costs down. The partial HDI and Hybrid Lamination technologies enable the use of low Dk and low loss material for acceptable performance in multiband solutions and higher frequencies. In one example embodiment, a low dielectric constant and low loss material is used for a narrowband antenna solution and the advantage is that, because of the improved material parameter tolerance, the antenna performance remains relatively unaffected due to batch processes.

A HDI-PWB may be provided having an integrated localized region or portion of material having low loss radio frequency properties for providing an efficient antenna in a portable electronic device. The idea of having a partial HDI circuit board having a localised portion of low loss (at radio frequencies) material for use with an antenna element is new. It may not be necessary to have a low dielectric constant (Er) at the frequency of operation as some antennas may need to be reduced in size by having a higher value of Er.

It should be noted that a PWB comprising features of the invention can comprise multiple partial HDI areas-inserts and/or multiple hybrid lamination areas with low loss insert/plug type areas.

An apparatus may be provided comprising a first printed wiring board section 28 comprising a first substrate 32, the first substrate comprising a first laminate with a first dissipation factor; and a second printed wiring board section 30 directly attached with the first printed wiring board section to form a unitary printed wiring board structure, the second printed wiring board section comprising a second substrate 34 and an antenna 36 on the second substrate, the second substrate comprising a second laminate with a different second dissipation factor. "On" as used in the previous sentence means that the antenna is directly or indirectly connected to the second substrate. The antenna (or radiator) could also be physically spaced from the substrate. The substrate in this case would provide a different material so the antenna/radiator would benefit from the adjacent substrate. In other words, the antenna may be an integral part of the PWB or it may be located above a surface of the PWB or other conductive member providing a ground plane.

The second laminate 66 may be located against an outward facing side of the first laminate 68. The first laminate can have a recess 40 and the second laminate can be located, at least partially, in the recess. The recess can extend entirely through the second laminate. The first and second sections may comprise a common exterior side 80 (see FIG. 3) of the unitary printed wiring board structure. The second laminate may have a loss tangent of about 0.001 or less. The second laminate may have a lower dielectric constant than a dielectric constant of the first laminate. The second laminate may have a higher dielectric constant than a dielectric constant of the first laminate. The antenna may be configured to operate at a frequency of 2 GHz or above. A third printed wiring board section may be provided directly attached with the first printed wiring board section 28 as part of the unitary printed wiring board structure, the third printed wiring board section comprising a third substrate and a second antenna on the third substrate, the third substrate comprising a third laminate with a dissipation factor which is different from the dissipation factor of the first laminate.

An example method can comprise providing a first printed wiring board module comprising a first substrate, the first substrate comprising a first laminate with a first dissipation factor; providing a second printed wiring board module separate from the first printed wiring board module, the second printed wiring board module comprising a second substrate having a second laminate with a different second dissipation factor; and connecting the second printed wiring board module directly to the first printed wiring board module to form a unitary printed wiring board structure. The second laminate can have a loss tangent of about 0.001 or less. Connecting the second printed wiring board module to the first printed wiring board module may comprise forming a recess in the first laminate and locating the second printed wiring board module, at least partially, in the recess. Connecting the second printed wiring board module to the first printed wiring board module may comprise locating the second laminate at a major outward facing side of the first laminate. Connecting the second printed wiring board module to the first printed wiring board module may comprise the first and second substrates being coplanar located relative to each other. Providing the first and second modules may comprise the second laminate having a lower dielectric constant than a dielectric constant of the first laminate. Providing the first and second modules may comprise the second laminate having higher dielectric constant than a dielectric constant of the first laminate. The method may further comprise forming an antenna on the second printed wiring board module which is configured to operate at a frequency of 2 GHz or above. The method may further comprise connecting a third printed wiring board module with the first printed wiring board module as part of the unitary printed wiring board structure, the third printed wiring board module comprising a third substrate and a second antenna on the third substrate, the third substrate comprising a third laminate with a dissipation factor which is different from the dissipation factor of the first laminate.

An example apparatus may comprise a first printed wiring board section comprising a first substrate, the first substrate including a first laminate having a first loss tangent greater than 0.001; and a second printed wiring board section which is smaller than the first printed wiring board section directly attached with the first printed wiring board section to form a unitary printed wiring board structure, the second printed wiring board section comprising a second substrate including a second laminate having a loss tangent of 0.001 or less.

An example method can comprise lay-up and alignment of components of a printed wiring board substrate comprising a first substrate epoxy laminate material with a first dissipation factor and a separate second substrate epoxy laminate material with a second different dissipation factor, the second dissipation factor being lower than the first dissipation factor; pressing the components together where the second substrate epoxy laminate material is located as only a partial layer with all sides except one side covered by other ones of the components; drilling, imaging and plating on the components to form a printed wiring board; and forming an antenna circuit on the printed wiring board over the second substrate epoxy laminate material, a majority of the antenna circuit being located over the second substrate epoxy laminate material where the lower dissipation factor of the second substrate epoxy laminate material assist to reduce loss from antenna operation at a frequency above 2 Ghz.

It should be understood that the foregoing description is only illustrative of the invention. Various alternatives and modifications can be devised by those skilled in the art without departing from the invention. For example, features recited in the various dependent claims could be combined with each other in any suitable combination(s). In addition, features from different embodiments described above could be selectively combined into a new embodiment. Accordingly, the invention is intended to embrace all such alternatives, modifications and variances which fall within the scope of the appended claims.

What is claimed is:

1. An apparatus comprising: a first printed wiring board section comprising a first dielectric material layer, the first dielectric material layer comprising a first dissipation factor; and a second printed wiring board section directly attached with the first printed wiring board section to form a unitary printed wiring board structure, the second printed wiring board section comprising a second dielectric material layer and an antenna on the second dielectric material layer, the second dielectric material layer comprising a different second dissipation factor, where the second dissipation factor is lower than the first dissipation factor, where a majority of the antenna circuit is located over the second dielectric material layer where the lower dissipation factor of the second dielectric material layer is configured to assist to reduce loss from antenna operation at a frequency above 1 Ghz.

2. The apparatus as in claim 1 where the first dielectric material layer comprises a first laminate, where the second dielectric material layer comprises a second laminate, and where the second laminate is located against an outward facing side of the first laminate.

3. The apparatus as in claim 1 where the first dielectric material layer comprises a first laminate, where the second dielectric material layer comprises a second laminate, and where the first laminate has a recess and the second laminate is located, at least partially, in the recess.

4. The apparatus as in claim 3 where the recess extends entirely through the second laminate.

5. The apparatus as in claim 1 where the first and second sections comprise a common exterior side of the unitary printed wiring board structure.

6. The apparatus as in claim 1 where the first dielectric material layer comprises a first laminate, where the second dielectric material layer comprises a second laminate, and where the second laminate has a loss tangent of about 0.001 or less.

7. The apparatus as in claim 1 where the first dielectric material layer comprises a first laminate, where the second dielectric material layer comprises a second laminate, and where the second laminate has a lower dielectric constant than a dielectric constant of the first laminate.

8. The apparatus as in claim 1 where the first dielectric material layer comprises a first laminate, where the second dielectric material layer comprises a second laminate, and where the second laminate has a higher dielectric constant than a dielectric constant of the first laminate.

9. The apparatus as in claim 1 where the antenna is configured to operate at a frequency of 2 GHz or above.

10. The apparatus as in claim 1 further comprising a third printed wiring board section directly attached with the first printed wiring board section as part of the unitary printed wiring board structure, the third printed wiring board section comprising a third dielectric material layer and a second antenna on the third dielectric material layer, the third dielectric material layer comprising a dissipation factor which is different from the dissipation factor of the first dielectric material layer.

11. The apparatus as in claim 1 where the second printed wiring board section comprises a printed wiring board configured to be formed using a partial high density interconnect (HDI) process.

12. The apparatus as in claim 1 where the second printed wiring board section comprises a printed wiring board configured to be formed using a hybrid lamination process.

13. An apparatus comprising:
a first printed wiring board section comprising a first dielectric material layer, the first dielectric material layer having a first loss tangent greater than 0.001; and
a second printed wiring board section which is smaller than the first printed wiring board section directly attached with the first printed wiring board section to form a unitary printed wiring board structure, the second printed wiring board section comprising a second dielectric material layer and an antenna on the second dielectric material layer, the second dielectric material layer having a loss tangent of 0.001 or less.

14. A portable electronic device comprising the apparatus as claimed in claim 1.

* * * * *